United States Patent [19]
Dutartre et al.

[11] Patent Number: 6,162,706
[45] Date of Patent: Dec. 19, 2000

[54] METHOD OF EPITAXY ON A SILICON SUBSTRATE COMPRISING AREAS HEAVILY DOPED WITH ARSENIC

[75] Inventors: Didier Dutartre, Meylan; Patrick Jerier, Grenoble, both of France

[73] Assignee: STMicroelectronics S.A., Gentilly, France

[21] Appl. No.: 09/124,825

[22] Filed: Jul. 29, 1998

[30] Foreign Application Priority Data

Jul. 31, 1997 [FR] France ................................. 97 10032

[51] Int. Cl.$^7$ ................................................. H07L 21/44
[52] U.S. Cl. .................... 438/481; 148/175; 156/612; 438/478; 438/495; 438/509
[58] Field of Search ........................ 148/175; 156/612; 438/478, 481, 495, 509

[56] References Cited

U.S. PATENT DOCUMENTS

| | | | |
|---|---|---|---|
| 3,669,769 | 6/1972 | Badami et al. | 148/175 |
| 3,716,422 | 2/1973 | Ing et al. | 148/175 |
| 3,759,760 | 9/1973 | Encinas | 148/175 |
| 5,221,412 | 6/1993 | Kagata et al. | 156/612 |
| 5,356,837 | 10/1994 | Geiss et al. | 437/200 |
| 5,432,121 | 7/1995 | Chan et al. | 437/95 |

OTHER PUBLICATIONS

French Search Report from French Patent Application 97 10032, filed Jul. 31, 1997.

Patent Abstracts of Japan, vol. 6, No. 211 (E–137), Oct. 23, 1982 & JP–A–57 115822 (Nippon Denki KK).

Ishii, et al., "Silicon Epitaxial Wafer With Abrupt Interface By Two Step Epitaxial Growth Technique" Journal Of The Electrochemical Society, vol. 122, No. 11, Nov. 1975, Manchester, New Hampshire, US, pp. 1523–1531.

*Primary Examiner*—Charles Bowers
*Assistant Examiner*—Lisa Kilday
*Attorney, Agent, or Firm*—Wolf, Greenfield & Sacks, P.C.; James H. Morris; Theodore E. Galanthay

[57] ABSTRACT

The present invention relates to a method of vapor phase epitaxial deposition of silicon on a silicon substrate including areas containing dopants at high concentration among which is arsenic, while avoiding an autodoping of the epitaxial layer by arsenic, including the steps of performing a first thin epitaxial deposition, then an anneal; the conditions and the duration of the first epitaxial deposition and of the anneal being such that the arsenic diffusion length is much lower than the thickness of the layer formed in the first deposition; and performing a second epitaxial deposition for a chosen duration to obtain a desired total thickness.

10 Claims, 4 Drawing Sheets

METHOD OF EPITAXY ON A SILICON SUBSTRATE COMPRISING AREAS HEAVILY DOPED WITH ARSENIC

BACKGROUND OF THE INVENTION

1. Field of the Invention

The present invention relates to the manufacturing of semiconductor components, and more specifically to the deposition by epitaxy of a silicon layer on a single crystal silicon substrate.

2. Discussion of the Related Art

Generally, in the field of semiconductor component manufacturing, it is known to grow epitaxial layers of a determined type of conductivity and level of doping on substrates of a determined type of conductivity, generally different from that of the epitaxial layer, and of a determined doping level. The epitaxy process obtains thin single crystal layers having a constant doping level across their thickness, conversely to methods implying a dopant diffusion step, in which the doping level decreases with the diffusion depth.

Vapor phase epitaxy methods, which have been developed for many years, operate very satisfactorily when the doping level of the substrate is homogenous and relatively low. However, in modern technologies, buried layers, that is, heavily-doped localized layers of the first and/or of the second type of conductivity formed under the epitaxial layer are used more and more. The buried layers are obtained by first performing a high dose implantation of a dopant chosen in the substrate before performing the epitaxial growth. These layers are, for example, meant to form bipolar transistor collectors and must be very heavily doped. This results in a known drawback, currently called autodoping, which is that the implanted doping has a tendency, during the epitaxy process, to dope the epitaxial layer above and beside the implanted region. The epitaxied layer no longer has the desired resistivity. This disadvantage is becomes more significant as the epitaxial layer is made thinner since the autodoping phenomenon essentially occurs in the initial growth phase of this layer. Further, it obviously appears that the autodoping rate of the epitaxial layer depends on the surface of the doped areas meant to become buried layers. The larger this surface, the more the autodoping. Thus, from one circuit to another, according to whether more or less buried layers have been made, the epitaxial layer will not have the same general resistivity. This phenomenon is difficult to master. It goes against what is sought in any industrial method, that is, to obtain controlled and repeatable results, and which are, if possible, identical for different products of a given technology.

At the present time, many solutions have been brought forward to attempt to solve autodoping problems and more specifically to decrease arsenic autodoping without increasing boron autodoping upon deposition of a lightly-doped epitaxial layer on a substrate containing arsenic implanted areas and boron implanted areas.

It has, in particular, been proposed to reduce the pressure in the epitaxy reactor, to increase the duration of some thermal steps, especially the anneal step before the actual epitaxy, and to choose pressure conditions adapted to reducing the growth rate. These methods have yielded more or less satisfactory results according to the operating conditions but none has, up to now, been generally acclaimed.

It has also been proposed to perform an epitaxy in several steps but no satisfactory solution has been provided and such a method is not used industrially. This may be due to the fact that, in an epitaxy, a very large number of parameters have to be set and optimized, among which are the pressure, the temperature, the duration of each step, the shiftings between steps, the compositions of the gases, etc.

Further, if some of the solutions brought forward have reduced the autodoping due to arsenic, they have worsened the autodoping due to other dopants such as boron and the general result has thus not been satisfactory.

SUMMARY OF THE INVENTION

Thus, the present invention aims at a method of epitaxial deposition of silicon on a silicon substrate in which various dopants at high concentration rates are previously implanted to form buried layers and especially arsenic and boron.

To achieve this and other objects, the present invention provides a method of vapor phase epitaxial deposition of silicon on a silicon substrate including areas containing dopants at high concentration among which is arsenic, while avoiding autodoping of the epitaxial layer by arsenic, including the steps of a) performing a first thin epitaxial deposition; b) performing an anneal; the conditions and the duration of the first epitaxial deposition and of the anneal being such that the arsenic diffusion length is much lower than the thickness of the layer formed in the first deposition; and c) performing a second epitaxial deposition for a chosen duration to obtain a desired total thickness.

According to an embodiment of the present invention, the first epitaxial deposition is preceded by an initial anneal step.

According to an embodiment of the present invention, the first epitaxial deposition is performed at a temperature on the order of 1100° C. and the second epitaxial deposition is performed at a temperature on the order of 1050° C.

According to an embodiment of the present invention, the first deposition is pursued for a duration sufficient to obtain a thickness on the order of 40 to 60 nanometers.

According to an embodiment of the present invention, the steps of anneal without epitaxy formation are performed in the presence of hydrogen.

According to an embodiment of the present invention, during steps a) and b), the operating parameters of the epitaxy reactor are chosen to be outside the usual ranges imposed for a homogenous epitaxial growth.

According to an embodiment of the present invention, the flow of carrier gas is increased with respect to usual conditions.

According to an embodiment of the present invention, the epitaxial depositions are performed in the presence of an arsenic source.

According to an embodiment of the present invention, step b) is performed in the presence of an arsenic source.

The foregoing objects, features and advantages of the present invention will be discussed in detail in the following non-limiting description of specific embodiments in connection with the accompanying drawings.

DETAILED DESCRIPTION

Figure 1:
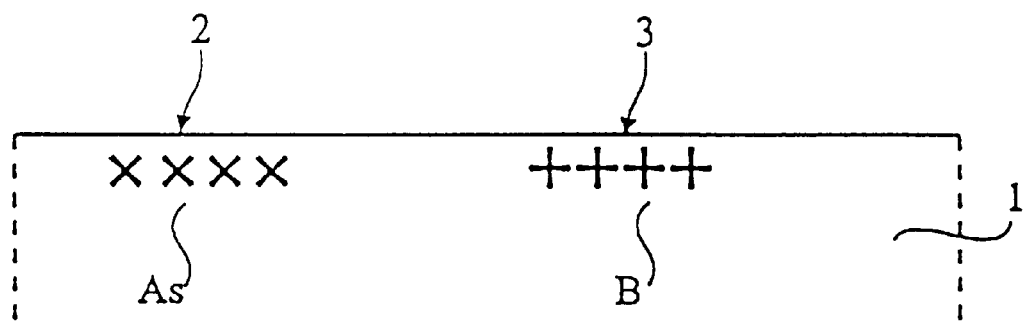
FIGS. 1 and 2 schematically show a method of epitaxy with formation of buried layers.

Conventionally, to form an epitaxial layer on a single crystal silicon substrate 1, as is shown in FIG. 1, areas 2 and 3 in which are performed high dose implantations of dopants meant to form buried layers are first formed in substrate 1. In the example shown, area 2 contains arsenic and area 3 contains boron.

Figure 2:
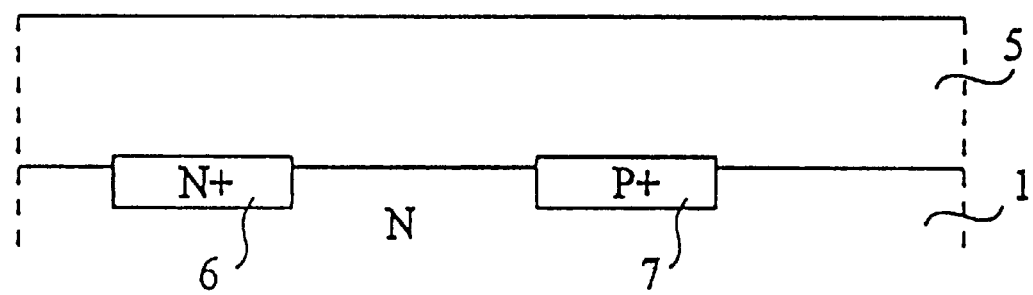

Then, as is shown in FIG. 2, a single crystal silicon layer 5 is developed by epitaxy and regions 2 and 3 then respectively correspond to buried layers 6 and 7. The epitaxial growth is for example performed under low pressure in the presence of hydrogen and of a silicon compound such as dichlorosilane or trichlorosilane and in the presence of a dopant compound, for example phosphine to form an N-type phosphorous doped layer. The problem is that the doping of the epitaxial layer is influenced by the exodiffusions from the buried layers.

Figure 3:
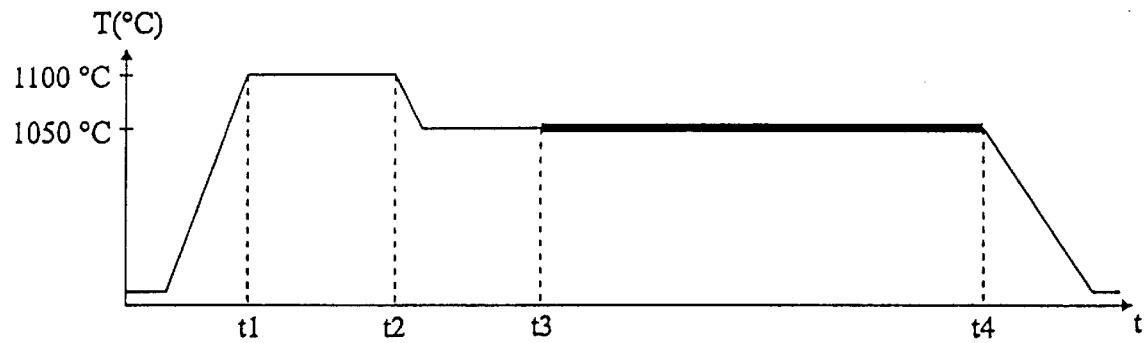
FIG. 3 illustrates an epitaxy method according to prior art.

FIG. 3 illustrates a conventional thermal sequence, with two temperature stages, used in an epitaxy. The temperature is first increased in an epitaxy reactor, to reach at a time $t_1$ a desired temperature, generally higher than the temperature provided for the deposition, for example, 1100° C., in presence of hydrogen at low pressure, for example, 60 torrs (approximately $10^4$ Pa). The temperature is maintained for a certain duration, until a time $t_2$, after which the temperature is decreased to the temperature chosen for the epitaxial deposition, for example, 1050° C., and the stabilization of the temperature is awaited until a time $t_3$, then the actual deposition is performed in presence of hydrogen and, for example, of dichlorosilane, until a time $t_4$. Duration $t_3$–$t_4$ is chosen, according to the partial gas pressures, to obtain a deposition of chosen thickness. After this, the temperature is decreased again at an equally determined rate. Many descriptions of such a method can be found in literature.

Figure 4:
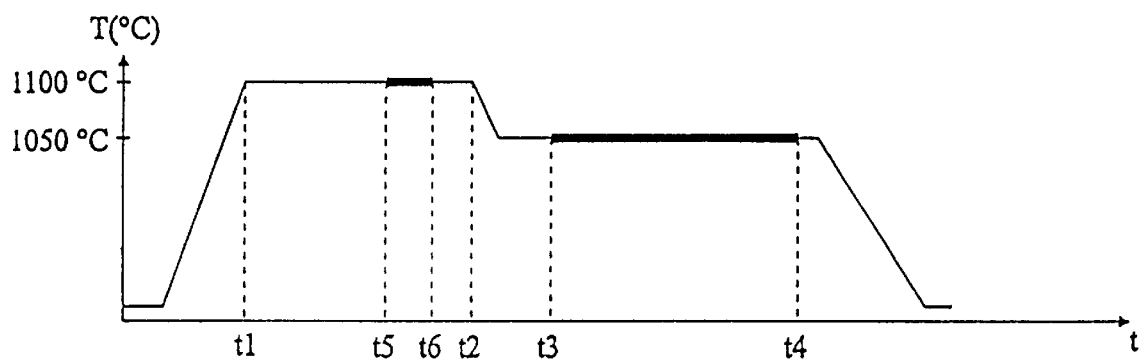
FIG. 4 illustrates an epitaxy method according to the present invention.

FIG. 4 illustrates an example of a thermal sequence according to the present invention. It should be noted that this is an example only and general rules from which several alternative embodiments of the present invention may be deduced will be indicated hereafter. As in the case of FIG. 3, this sequence includes two steps at high temperature, for example 1100° C. and 1050° C. According to the present invention, during the step at the first temperature, between times $t_5$ and $t_6$, a limited epitaxial growth phase is performed, for example, to obtain a layer of a thickness of 40 to 60 nm. After this, a first waiting time at high temperature is provided between times $t_6$ and $t_2$ and a second waiting time at a lower temperature is provided between times $t_2$ and $t_3$. The first and second waiting times can have substantially the same duration. The duration $t_2$–$t_3$ is longer than the duration $t_5$–$t_6$. As will be seen hereafter, the provision of these waiting times is a characteristic of the present invention. Then, between times $t_3$ and $t_4$, an epitaxy is performed, for example, in the same conditions as those previously illustrated but for a lower duration since a portion of the epitaxial layer has already been formed.

As a numerical example, the duration of initial anneal between times $t_1$ and $t_5$ may be 60 seconds, the deposition duration between times $t_5$ and $t_6$ may be on the order of 15 seconds, and the waiting duration between times $t_6$ and $t_3$ may be on the order of 30 seconds. The deposition duration between times $t_3$ and $t_4$, higher than one minute, is chosen according to the thickness of the epitaxied layer to be grown.

Duration $t_5$–$t_6$, duration $t_6$–$t_3$, and the thickness of the epitaxied layer formed between times $t_5$ and $t_6$ are such that the thickness of the epitaxied layer is higher than the arsenic diffusion length during duration $t_5$–$t_3$. The diffusion length is defined as the mean distance over which arsenic atoms diffuse in a given duration in given temperature conditions. For the durations given hereabove as an example, the arsenic diffusion length in duration $t_5$–$t_6$ at 1100° C. is on the order of 20 nm and the diffusion distance in duration $t_6$–$t_3$, most of which is performed at a lower temperature, also is on the order of 20 nm. Thus, the total diffusion length is lower than the thickness of the formed layer which, as it should be recalled, is on the order of 40 to 60 nm.

Figure 5A:
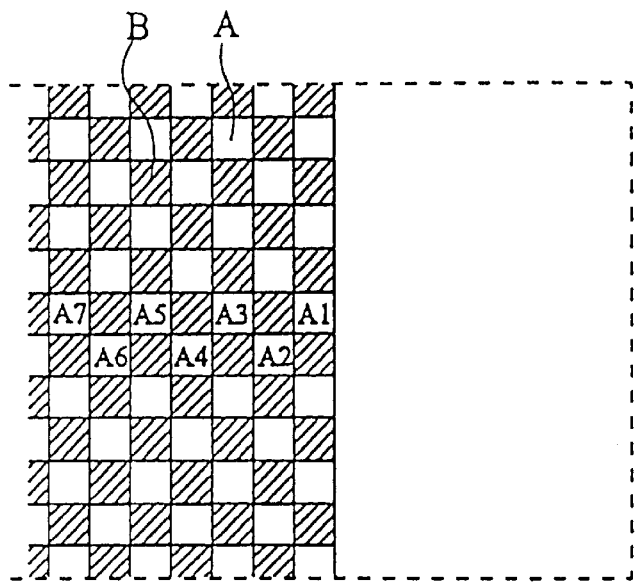
FIG. 5A is a top view of a test wafer and FIG. 5B illustrates compared results of arsenic autodoping in epitaxial layers formed according to a conventional method and according to the method of the present invention.

FIG. 5A is a top view of a test wafer specifically made to analyze the efficiency of the method of the present invention. Before the epitaxy, the wafer is divided in two portions, a first portion, to the right of the drawing, where no implantation is performed, and a second portion, to the left of the drawing, where a tablecloth of areas A, not implanted, and of areas B having undergone a strong arsenic implantation, is performed. A1 to A7 designate non-implanted square of the tablecloth extending from the limit between the right-hand and left-hand portions of the drawing. In an example of embodiment, each square of the tablecloth has a dimension of 10 ×10 mm.

Figure 5B:
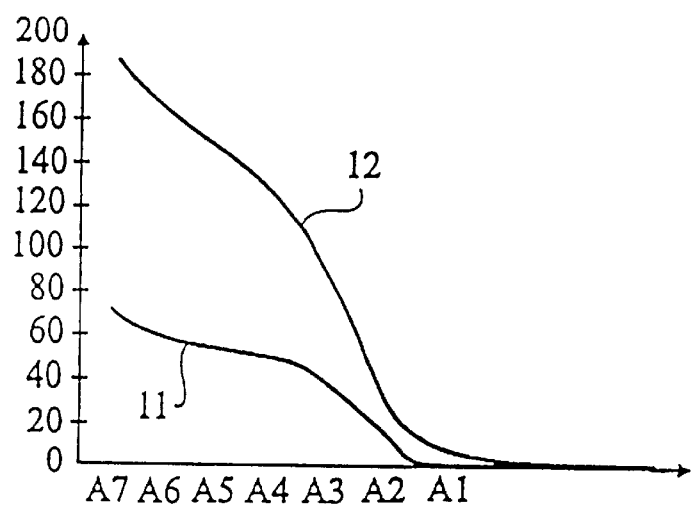

FIG. 5B illustrates compared results of arsenic autodoping in epitaxial layers formed according to a conventional method and according to the method of the present invention above the wafer of FIG. 5A. The resistivities measured from the wafer surface above non-implanted areas are compared. Clearly, the influence of the implanted areas increases from square A1 to square A7.

The variation of conductivity, in $\mu\Omega^{-1}$, appears to be much lower with the method of the present invention (curve 11) than with the conventional method (curve 12). Similar measurements performed with a test wafer similar to that of FIG. 5A, but in which the doped areas have undergone a boron implantation, have not shown any clear difference between the conventional method and the method of the present invention.

Thus, the result aimed at is obtained, that is, the arsenic autodoping is reduced while the boron autodoping is not altered.

An explanation of the phenomena which lead to this result, according to the present opinion of the inventors, will now be given. It should however be clear that, even if this theoretical explanation is erroneous or incomplete, this will not alter the scope of the present invention, the results of which have been demonstrated.

Figure 6A:
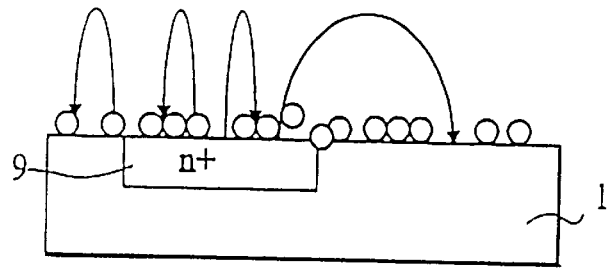
FIGS. 6A and 6B schematically illustrate a possible explanation of the arsenic autodoping in the prior art method.
Figure 6B:
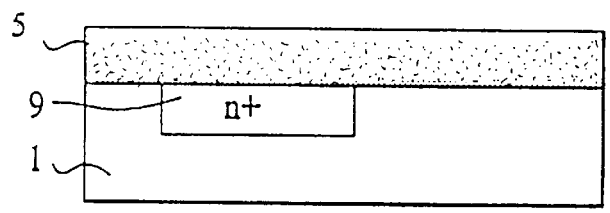

FIG. 6A schematically shows a substrate 1 in which arsenic atoms 2 have been implanted. The applicant considers that from the beginning of a heating, arsenic atoms exist at the substrate surface in a very thin, substantially monoatomic layer. During the epitaxy, this surface layer remains at the surface of the epitaxial layer being grown; it thus permanently forms an arsenic doping source. Thus, as shown in FIG. 6B, arsenic atoms distributed across the entire thickness of epitaxied layer 5 according to a decreasing profile from the interface to the surface, are finally obtained.

Figure 7A:
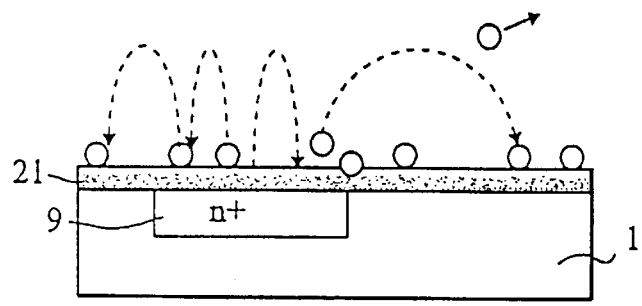
FIGS. 7A and 7B schematically illustrate a possible explanation of the reduction of the autodoping by the method according to the present invention.
Figure 7B:
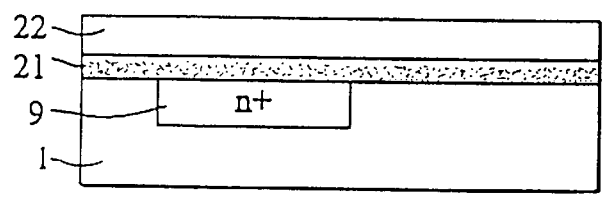

Conversely, according to the present invention, as shown in FIG. 7A, once the first epitaxied layer 21 resulting from the first deposition between times $t_5$ and $t_6$ is formed, the heating period between times $t_6$ and $t_3$ enables the surface arsenic atoms to be mostly eliminated and the surface concentration reaches a very low value. Thus, when the second epitaxy step is performed between times $t_3$ and $t_4$, there is practically no arsenic atom source since those atoms coming from the buried layer itself do not advance sufficiently by diffusion to pollute the formed layer, 22, as is shown in FIG. 7B.

Thus, the method in two steps according to the present invention considerably reduces the autodoping and limits it to the lower portion of the epitaxial layer, provided that the thickness of epitaxial layer 21 formed in the first step forms a barrier to the arsenic diffusion to its surface before the beginning of the second epitaxy step, the first portion of the epitaxied layer having a low thickness with respect to the general thickness of epitaxied layer 21–22.

Further, an advantage of the present invention is that during the preliminary steps, before the second phase of epitaxial deposition (between times $t_3$ and $t_4$), the various operating parameters can be chosen relatively freely. Indeed, the layer formed in the first epitaxy phase is very thin and its uniformity is not critical. This makes a difference with the constraints generally imposed for the use of an epitaxy reactor. These constraints (process window) are very strict if a uniform epitaxial deposition is desired to be maintained. In particular, during the preliminary steps, the rate (flow/pressure) of carrier gas (generally $H_2$) could be considerably increased to improve the arsenic surface sweep.

Of course, the present invention is likely to have various alterations, modifications, and improvements which will readily occur to those skilled in the art. For example, if the new process is desired to remain as compatible as possible with prior methods, a voluntary arsenic doping of the epitaxial layers formed could be provided, so that these layers substantially have the same behavior as the prior epitaxial layers formed in a single step. However, this doping will then have the advantage of being perfectly controlled and not to vary across the chip surface. This arsenic doping can result from an addition of arsine to the generally used phosphine. An atmosphere containing arsine can especially be provided between times $t_2$ and $t_3$ and especially little before time $t_3$.

Such alterations, modifications, and improvements are intended to be part of this disclosure, and are intended to be within the spirit and the scope of the present invention.

Accordingly, the foregoing description is by way of example only and is not intended to be limiting. The present invention is limited only as defined in the following claims and the equivalents thereto.

What is claimed is:

1. A method of vapor phase epitaxial deposition of silicon on a silicon substrate including areas containing dopants at high concentration among which is arsenic, while avoiding an autodoping of the epitaxial layer by arsenic, including the steps of:

a) performing a first epitaxial deposition;

b) performing an anneal after step a);

the conditions and the duration of the first epitaxial deposition and of the anneal being such that the arsenic diffusion length is lower than the thickness of the layer formed during the first deposition; and c) performing a second epitaxial deposition after step b) to obtain a desired total thickness.

2. The method of claim 1, wherein the first epitaxial deposition is preceded by an initial anneal step.

3. The method of claim 1, wherein the first epitaxial deposition is performed at a temperature on the order of 1100° C. and the second epitaxial deposition is performed at a temperature on the order of 1050° C.

4. The method of claim 3, wherein the first deposition is pursued to obtain a thickness on the order of 40 to 60 nanometers.

5. The method of claim 1, wherein the steps of anneal without epitaxy are performed in the presence of hydrogen.

6. The method of claim 1, wherein, during step a), the flow of carrier gas is increased.

7. The method of claim 1, wherein the epitaxial depositions are performed in presence of an arsenic source.

8. The method of claim 1, wherein step b) is performed in presence of an arsenic source.

9. The method of claim 1 wherein the step a) and the step c) are performed such that the thickness of the layer formed during the first deposition is low with respect to the total thickness of the layers formed during the first and the second depositions.

10. The method of claim 6 wherein a pressure of the carrier gas is greater than 60 torr.

* * * * *